United States Patent
Kashima et al.

(10) Patent No.: US 9,242,433 B2
(45) Date of Patent: Jan. 26, 2016

(54) TEXTURED SUBSTRATE FOR EPITAXIAL FILM FORMATION, AND METHOD FOR MANUFACTURING THE SAME

(71) Applicant: TANAKA KIKINZOKU KOGYO K.K., Tokyo (JP)

(72) Inventors: Naoji Kashima, Aichi (JP); Tomonori Watanabe, Aichi (JP); Shigeo Nagaya, Aichi (JP); Kunihiro Shima, Gunma (JP); Shuichi Kubota, Gunma (JP)

(73) Assignee: TANAKA KIKINZOKU KOGYO K.K., Toyko (JP)

( * ) Notice: Subject to any disclaimer, the term of this patent is extended or adjusted under 35 U.S.C. 154(b) by 0 days.

(21) Appl. No.: 14/381,255

(22) PCT Filed: Mar. 21, 2013

(86) PCT No.: PCT/JP2013/057984
§ 371 (c)(1),
(2) Date: Aug. 27, 2014

(87) PCT Pub. No.: WO2013/141272
PCT Pub. Date: Sep. 26, 2013

(65) Prior Publication Data
US 2015/0094208 A1    Apr. 2, 2015

(30) Foreign Application Priority Data

Mar. 22, 2012 (JP) ................... P2012-064918

(51) Int. Cl.
| | |
|---|---|
| B32B 15/04 | (2006.01) |
| B32B 9/00 | (2006.01) |
| C30B 25/18 | (2006.01) |
| B32B 15/01 | (2006.01) |
| H01L 39/24 | (2006.01) |
| H01L 39/12 | (2006.01) |

(52) U.S. Cl.
CPC ................. *B32B 15/01* (2013.01); *B32B 15/04* (2013.01); *C30B 25/18* (2013.01); *H01L 39/125* (2013.01); *H01L 39/2454* (2013.01); *H01L 39/2461* (2013.01)

(58) Field of Classification Search
CPC ... B32B 15/01–15/04; H01L 39/125–39/2461; C30B 25/18
See application file for complete search history.

(56) References Cited

U.S. PATENT DOCUMENTS

| | | | |
|---|---|---|---|
| 8,038,810 B2 * | 10/2011 | Kashima | B32B 15/015 117/9 |
| 8,039,119 B2 * | 10/2011 | Kashima | B32B 15/01 427/383.7 |
| 2005/0079116 A1 * | 4/2005 | Onabe | C23C 12/00 423/335 |
| 2006/0021788 A1 * | 2/2006 | Kohayashi | H01F 6/065 174/125.1 |
| 2009/0053550 A1 | 2/2009 | Kashima et al. | |
| 2011/0155050 A1 | 6/2011 | Kashima et al. | |

FOREIGN PATENT DOCUMENTS

| | | |
|---|---|---|
| JP | 2002-150855 A | 5/2002 |
| JP | 2008-266686 A | 11/2008 |
| JP | 2009-046734 | 3/2009 |
| JP | 2010-192349 A | 9/2010 |

* cited by examiner

*Primary Examiner* — Colleen Dunn
(74) *Attorney, Agent, or Firm* — Roberts & Roberts, LLP

(57) ABSTRACT

The present invention relates to a textured substrate for epitaxial film formation, comprising a textured metal layer at least on one side, wherein the textured metal layer includes a copper layer having a cube texture and a nickel layer having a thickness of 100 to 20000 nm formed on the copper layer; the nickel layer has a nickel oxide layer formed on a surface thereof, having a thickness of 1 to 30 nm, and including a nickel oxide; and the nickel layer further includes a palladium-containing region formed of palladium-containing nickel at an interface with the nickel oxide layer. The top layer of the textured substrate, i.e. the nickel oxide layer, has a surface roughness of preferably 10 nm or less.

20 Claims, No Drawings

TEXTURED SUBSTRATE FOR EPITAXIAL FILM FORMATION, AND METHOD FOR MANUFACTURING THE SAME

BACKGROUND OF THE INVENTION

1. Field of the Invention

The present invention relates to a textured substrate for forming and growing an epitaxial film of an oxide superconductive material or the like, and more specifically to a textured substrate for forming an epitaxial film having good crystal orientation and adhesion.

2. Description of the Related Art

Materials having an epitaxial crystalline structure with a crystal orientation such as an oxide superconductive film and a solar cell film are used in various fields due to the specific properties thereof. Examples of the materials include oxide superconductive materials which compose superconductive conductors and superconductive shields for use in various types of electric power equipment. Materials having an epitaxial crystalline structure generally exhibit poor workability and the bulk material made therefrom has cost disadvantage in some cases. Accordingly, for use of the material, a thin film is often formed from the material on a predetermined substrate.

In order to allow a crystal having textured structure to epitaxially grow, a substrate for epitaxial film formation is required to have a surface with a textured structure. Examples of the substrate include a textured substrate formed of copper as a main constituent found by the present inventors (Patent Literature 1). The copper substrate for epitaxial film growth takes advantage of the easiness of controlling the copper crystal orientation, having a {100}<001> cubic texture with a deviation angle $\Delta\phi$ of crystal axis which satisfies an expression: $\Delta\phi \leq 6°$. Although copper including no alloy element has insufficient strength, the problem was solved by cladding the substrate with a metal layer (base material) made of stainless steel or the like.

The present inventors made several modifications to the textured substrate for improving the quality of an epitaxial film to be formed thereon. For example, in a disclosed modification to the textured substrate having a copper layer, a thin film layer of nickel in a proper amount is laminated on the copper surface so as to further improve the crystal orientation (Patent Document 2).

PRIOR ART DOCUMENTS

Patent Documents

Patent Document 1
 Japanese Patent Application Laid-Open No. 2008-266686
Patent Document 2
 Japanese Patent Application Laid-Open No. 2009-046734

Previously, the suitability of a modification example of a substrate for the formation of an epitaxial film has often been determined based on the quality of the crystal orientation of the substrate itself. Since the characteristics of an epitaxial film to be formed on a substrate substantially depend on the characteristics of the substrate, the use of the criterion is not false. Even with use of a substrate having a crystal orientation modified to the maximum extent possible in forming an epitaxial film, however, the crystal orientation collapses or the produced epitaxial film has insufficient adhesion in some actual cases. The setting of conditions for film formation has been therefore difficult.

The actual problem of suitability for the formation of an epitaxial film also relates to a recent structural change of the material with use of an epitaxial film. For example, in forming conventional superconductive materials with use of a textural substrate, the superconductive material is not directly film formed on a substrate. Instead, an intermediate layer is formed between the superconductive material and the substrate in many cases. The intermediate layer usually includes a plurality layers such as a seed layer for alleviating mismatching between the lattice constant of the constituent metal of the substrate and the lattice constant of the superconductive material, and a barrier layer for preventing elements from diffusing from the superconductive material to the substrate. Recently simplification of the intermediate layer, removal of the seed layer in particular, has been deliberated for reducing the man-hour in a manufacturing process and improving the characteristics. The simplification of the intermediate layer creates challenging conditions for the formation of a high-quality superconductive film.

SUMMARY OF THE INVENTION

Problem to be Solved by the Invention

The present invention therefore provides a textured substrate for epitaxial film formation, which has good crystal orientation and allows a high-quality epitaxial film to be formed on the surface of the substrate; and a manufacturing method thereof.

Means for Solving the Problem

The present invention, solving the problem, provides a textured substrate for epitaxial film formation, which includes a textured metal layer at least on one side. The textured metal layer includes a copper layer having a cube texture and a nickel layer formed on the copper layer and having a thickness of 100 to 20000 nm. The nickel layer has a nickel oxide layer formed on a surface thereof, having a thickness of 1 to 30 nm, and including a nickel oxide. The nickel layer further includes a palladium-containing region formed of palladium-containing nickel at the interface with the nickel oxide layer.

The present invention relates to a textured substrate which allows a conventional textured substrate disclosed by the present inventors (Patent Literature 2) to be improved, having improved growth properties and adhesion of an epitaxial film with effective use of the good crystal orientation of the conventional textured substrate. More specifically, the conventional textured substrate disclosed by the present inventors includes a crystal orientation improving layer of nickel for further improving the crystal orientation of a copper substrate having good crystal orientation. A slight amount of addition of palladium to nickel also allows for good surface smoothness of a substrate. The present inventors confirmed that an ultra thin nickel oxide layer can be formed by oxidizing the textured substrate having good crystal orientation and smoothness under predetermined oxidation conditions. The present inventors found that the ultra thin nickel oxide layer has an improving action on the growth properties and adhesion of an epitaxial film. Through further investigation based on the findings, the present invention was conceived by clearly specifying proper conditions for the nickel oxide layer.

The present invention is described in detail in the following. As a precondition, the present invention is applicable to a textured substrate including a copper layer with a cube texture. As described above, this is because copper is the best in adjusting crystal orientation. Since the crystallographic orientation of the copper layer has a face-centered cubic lattice, the copper layer has a {100}<001> cubic texture. It is obviously preferred that the copper layer have a good crystal orientation. Preferably the crystal orientation has a deviation angle $\Delta\phi$ of 6° or less.

The nickel layer formed on the copper layer acts as a layer for improving the crystal orientation of the surface of the copper layer. Nickel is used as the crystal orientation improving layer from the viewpoints of the crystal structure and the lattice constant of the underlying copper substrate, and particular effectiveness in improving the crystal orientation. The thickness of the nickel layer can be 100 to 20000 nm. A thickness more than the range causes the deviation in growth orientation of an epitaxial film to be subsequently formed. A thickness less than 100 nm produces no effect for improving the crystal orientation. More preferably the thickness of the nickel layer can be 500 to 10000 nm.

The nickel oxide layer formed on the nickel layer has an improving action on the growth properties and the adhesion of an epitaxial film as described above. The nickel oxide layer needs to have an extremely thin thickness of 1 to 30 nm. This is because a thickness more than 30 nm rather have negative effects on the growth properties of an epitaxial film. The thickness of the nickel oxide layer needs to be at least 1 nm, preferably being 5 nm or more.

The nickel oxide layer having a thickness in the range preferably has good surface smoothness. Although the reason of the positive effect of the formation of nickel oxide layer on improvement in the growth properties and the adhesion of an epitaxial film is not known, the present inventors believe that the nickel oxide layer formed on a smooth nickel layer has surface smoothness, which has effect on the formation of an epitaxial film. More specifically, with respect to the surface smoothness of the nickel oxide layer, the surface roughness (center-line surface roughness (Ra)) is preferably 10 nm or less.

The nickel layer, i.e. crystal orientation improving layer, includes a palladium-containing region formed of palladium-containing nickel at the interface with the nickel oxide layer. The palladium-containing region is formed due to diffusion of palladium added during formation of the nickel layer into the nickel layer. While the addition of palladium to the nickel layer is performed for improving the smoothness of the nickel layer surface, the nickel oxide layer in a favorable state cannot be formed from a nickel layer to which no palladium is added. Accordingly, the palladium-containing region in the nickel layer is an essential constituent of the present invention.

The palladium-containing region is formed of an alloy phase of palladium and nickel, of which composition in the region is not necessarily fixed and allows for a gradient change in palladium concentration. In a preferred aspect of the palladium-containing region, the region has a depth from the nickel layer surface of 50 to 200 nm and an average palladium concentration of 1 to 25 mass % with a balance of nickel. An excessive amount of added palladium to produce a depth of the palladium-containing region more than 200 nm causes the problem of reducing the smoothness of the nickel layer surface. The depth and the composition of the palladium-containing region can be changed depending on the amount of added palladium and the heat treatment for formation of the nickel layer, which is to be described.

The textured substrate of the present invention allows the crystal orientation of a copper layer to be improved and the growth properties and the adhesion of an epitaxial film to be secured, due to the presence of the nickel oxide layer and the nickel layer having the palladium-containing region as described above. As a result of the effect of the nickel layer for improving crystal orientation, the orientation degree ($\Delta\phi$) of the copper layer surface is improved in the range of 0.1 to 3.0°.

The textured substrate for epitaxial film growth of the present invention may be formed of a single layer including a textured metal layer alone. The copper layer may be joined to a reinforcement material, i.e. a base material. The base material for use in the textured substrate may preferably include any one of stainless steel and a nickel alloy (e.g. a hastelloy alloy, an inconel alloy, an incoloy alloy, and a monel alloy). The thickness and the shape of the textured substrate are not specifically limited, including a plate form, a foil form, and a tape form, depending on application. Furthermore, a copper layer may be joined to each of both sides of the base material, on which a nickel layer and a nickel oxide layer may be formed.

The method for manufacturing the textured substrate for epitaxial film formation of the present invention is described in the following. The method for manufacturing the textured substrate of the present invention includes the steps of: forming a nickel layer on the surface of a copper layer having a cube texture by epitaxial growth; adding palladium to the nickel layer surface to a film thickness equivalent of 1 to 20 nm; heating at 400° C. or higher in a nonoxidizing atmosphere for a first heat treatment; and further heating at 400° C. or higher in a vacuum atmosphere having an oxygen partial pressure of $10^{-21}$ to 1 Pa for a second heat treatment.

In the manufacturing method, the copper layer having a cube texture can be manufactured by a conventional method, and the cube texture can be properly produced by heat treatment for processing. Preferably the nickel layer is formed by epitaxial growth for preserving or improving the crystal orientation of the copper layer. The method for manufacturing an epitaxial film is not specifically limited. The epitaxial film may be manufactured by any of various processes for manufacturing a thin film such as pulse laser vapor deposition (PLD), chemical vapor deposition (CVD), spattering, vacuum vapor deposition, ion plating, ion beam vapor deposition, spin coating, molecular beam epitaxy (MBE), and plating. Plating is particularly preferred.

As described above, palladium is added to the nickel layer so as to smooth the nickel layer and further to smooth the nickel oxide layer to be subsequently formed. The action of addition of palladium can be explained based on the investigation by the present inventors as follows. The nickel layer surface having irregularities formed by epitaxial growth has high surface energy, being inclined to be smoothed and stabilized when energy is imparted by heat treatment or the like. The addition of a slight amount of palladium creates a so-called catalytic action, which allows for easier smoothing in combination with heat treatment.

The amount of added palladium is slight, being set to a film thickness equivalent of 1 to 20 nm. The "film thickness equivalent" is calculated from the surface area of the nickel layer (projected area in disregard of irregularities) and the amount (weight) and the density of palladium to be added. The criterion is employed, since an extremely slight amount of added palladium is required. The amount to fully cover the nickel layer surface having irregularities may cause overabundance. The amount of addition is set to 1 to 20 nm, because an amount less than 1 nm produces no effect, while an amount more than 20 nm markedly damages the smoothness of the nickel layer surface.

The method for adding palladium is not specifically limited so long as a slight amount of metal having a film thickness equivalent of 1 to 20 nm can be added under control. The preferred method is by any of various processes for manufacturing a thin film such as PLD, CVD, spattering, vacuum vapor deposition, ion plating, ion beam vapor deposition, spin coating, MBE, and plating. Plating is particularly preferred.

After addition of palladium, the nickel layer surface is smoothed by heat treatment (first heat treatment). The heat treatment is performed at a temperature of 400° C. or higher in a nonoxidizing atmosphere. At a temperature lower than 400° C., the migration of atoms for smoothing the surface is slowed. The upper limit of the temperature for heat treatment is preferably 1050° C. A temperature higher than the limit may cause softening or melting down of the copper layer in some cases. Preferably the time for heat treatment is 10 minutes to 2 hours. This is because a time for heat treatment less than 10 minutes causes insufficient migration of atoms for smoothing the surface; and a time for heat treatment more than 2 hours produces no difference in the effect. The reason for using a nonoxidizing atmosphere for heat treatment is that the heat treatment in an oxidizing atmosphere in this stage will form an undesirable nickel oxide layer. Examples of the atmosphere for the first heat treatment include a reducing atmosphere such as hydrogen gas, carbon monoxide-carbon dioxide mixed gas, and argon-hydrogen gas.

The first heat treatment allows the nickel layer surface to be smoothed, the added palladium to diffuse into the nickel layer, and a palladium-containing region to be formed at the surface. A heat treatment (second heat treatment) is performed in that state, so that a smooth nickel oxide layer can be formed.

Since the nickel oxide layer needs to have an extremely thin thickness of 1 to 30 nm, the heat treatment conditions for controlling the thickness are required to be specified. As a condition for the second heat treatment, the heat treatment needs to be performed in vacuum, more specifically in a vacuum atmosphere having an oxygen partial pressure of $10^{-21}$ to 1 Pa. The temperature for heat treatment is set at 400° C. or higher. The upper limit of heat treatment is preferably 1050° C., since a heat treatment under conditions in a more oxidizing environment than the temperature causes excessive growth of an oxide layer. Preferably the time for heat treatment is set at 1 minute to 30 minutes.

Each of the steps described above are performed to manufacture a textured substrate. The textured substrate of the present invention is supposed to be used in a state where the copper layer is joined to a reinforcement material. In manufacturing a textured substrate having a reinforcement material, the timing for joining the reinforcement material is not specifically limited so long as the texturing processing of the copper layer is completed. The timing may be before or after formation of the nickel layer, and may be after addition of palladium to the nickel layer and the first and second heat treatment.

Preferably the method for joining a reinforcement material to a substrate is performed by surface activated bonding. The surface activated bonding includes: dry etching the joint surface of a member to be joined so as to remove oxides and adsorbates on the joint surface for exposure and activation of a base metal surface; and joining the surfaces immediately after dry etching. The joining by the method is based on the atomic force between metal atoms (molecules) having no impurities such as oxides on the surface. As a specific method for dry etching for surface activation, any of argon or other ion beam etching, argon atom beam etching and plasma etching may be used. A nonoxidizing atmosphere is required for performing the dry etching. Preferably the dry etching is performed under high vacuum.

The surface activated bonding allows for joining without application of pressure. Even only superposition of materials to be joined may achieve joining. Pressure may be, however, applied to adjust positions of both materials or to enhance the strength of joining. The applied pressure is low enough not to cause deformation of the material, preferably 0.01 to 300 MPa. The surface activated bonding allows for joining at normal temperature. It is therefore not necessary to heat the processing atmosphere during joining. A nonoxidizing atmosphere is preferred also for the joining.

The textured substrate for epitaxial film formation of the present invention described above is suitable for forming an epitaxial film thereon, being suitably used as, for example, a substrate for a superconductive material. The superconductive material includes a superconductive material layer formed on the textured metal layer of the textured substrate of the present invention, usually having an intermediate layer between the substrate and the superconductive material layer. The intermediate layer has a action as a buffer layer with consideration for the difference in the lattice constant between a superconductive material (e.g. YBCO) and the metal which constitutes the substrate, and an action as a barrier layer for blocking the diffusion of metal elements contained in the substrate. Examples of the constitution of an intermediate layer include a three-layer structure having a seed layer, a barrier layer, and a cap layer, and a two-layer structure which excludes the seed layer from the three-layer structure. Each of the intermediate layers includes any one of oxide, carbide, and nitride, having a thickness of, preferably, 10 to 1000 nm.

Specific examples of the constituent material of intermediate layer include oxides such as cerium oxide and zirconium oxide, composite oxides such as LaMnO, LaZrO, and GdZrO, and nitrides such as TiN. For such oxides and composite oxides, oxides and composite oxides having a perovskite structure or a fluorite structure are preferred. A seed layer formed of a rare earth element oxide or a composite oxide including a rare earth element, a barrier layer formed of an oxide including zirconium oxide, a cap layer formed of a rare earth element oxide or a composite oxide including a rare earth element are particularly preferred.

The method for manufacturing each of the oxides to form an intermediate layer on a substrate may be by PLD, CVD, spattering, ion plating, ion beam vapor deposition, spin coating, MBE, and metal organic deposition (MOD). A superconductive material layer may be formed by the same method. A stabilization layer may be formed by a film forming method such as spattering and vapor deposition, and alternatively by joining a copper layer in a foil form to a silver layer formed by any of the methods in advance with brazing material.

Preferred examples of the oxide superconductive material to constitute a superconductive material layer include RE based superconductive materials, $RE\#Ba_2Cu_3O_x$ (RE represents one or two or more rare earth elements) in particular, more specifically YBCO, SmBCO, GdBCO, and $Y_{0.3}Gd_{0.7}BCO$. The superconductive material layer may be formed of the superconductive material alone, and alternatively an oxide different from the superconductive material may be added for artificial pinning to improve superconductive characteristics. The thickness of the superconductive material layer is preferably 100 nm or more.

Advantageous Effects of Invention

As described above, the textured substrate for epitaxial film formation of the present invention has good crystal orientation and allows the epitaxial film having good crystal orientation and adhesion to be formed on the substrate. More relaxed conditions for the epitaxial film growth can be set compared to conventional ones. The present invention provides a suitable substrate for manufacturing various materials and devices to which the characteristics of an epitaxial film are applied such as superconductive materials and solar cells.

DETAILED DESCRIPTION OF PREFERRED EMBODIMENTS

The best mode of embodiment of the present invention is described in the following.

(First Embodiment)

A copper plate in a tape form having a plate thickness of 1000 μm was prepared and cold rolled at room temperature with mill rolls at a reduction ratio of 95% so as to produce a 50-μm tape material. After rolling, the copper plate was heat treated to produce a textured crystal structure, i.e. a {100}<001> cubic texture. The heat treatment was performed at a temperature of 750° C. for 2 hours in an atmosphere of 95% nitrogen gas and 5% hydrogen gas.

A nickel layer, i.e. a crystal orientation improving layer, was formed on the copper plate which had been subjected to the above texturing processing, by plating. In nickel plating, the substrate was degreased with acid, electrolytically degreased, and then electrolytically plated in a nickel plating bath (Watts bath). The plating conditions are set at a temperature of 40° C. and a current density of 1 A/dm$^2$. The plating time was adjusted to have a thickness of nickel plating of 1000 nm. In forming a crystal orientation improving layer of nickel by plating, conditions are set in the range with a current density of 1 to 5 A/dm$^2$, and a bath temperature of 40 to 60° C.

As a reinforcement material, a stainless steel plate (SUS 304) in a tape form having a thickness of 100 μm was joined to the copper plate plated with nickel. In joining of the stainless steel plate, both of the surfaces of the copper substrate and the stainless steel plate to be joined were activated with fast atomic beams (argon) from a surface activated bonding device, and both were joined with a mill roll. The conditions for surface activated bonding were as follows:

Degree of vacuum: $10^{-5}$ Pa
(in a vacuum chamber; under argon gas atmosphere in an etching chamber.)
Applied voltage: 2 kV
Etching time: 5 min
Applied pressure during bonding: 2 MPa Palladium was then added to the surface of the nickel layer. The palladium was added by plating. In palladium plating, a commercially available palladium plating solution is used, and the plating time was adjusted to have a film thickness equivalent of 10 nm as an amount added, at a bath temperature of 30 to 50° C., and at a current density of 1 to 3 A/dm$^2$. After addition of palladium, heat treatment was performed at 700° C. for 1 hour in a nonoxidizing atmosphere (nitrogen-hydrogen mixed gas).

Heat treatment was performed in vacuum so as to form a nickel oxide layer. In the heat treatment, heating was performed at 500° C. for 20 minutes in vacuum having an oxygen partial pressure of $10^{-4}$ Pa.

COMPARATIVE EXAMPLE

In First Embodiment, a textured substrate was manufactured without addition of palladium after formation of a nickel layer, and without the subsequent two types of heat treatment.

The surface roughness and the orientation degree (Δφ) of the substrate surface (nickel oxide layer surface) of the textured substrate manufactured through the steps described above were measured. The surface roughness and Δφ were measured by atomic force microscope (AFM) observation and x-ray diffraction analysis (Δφ scanning). The values of a copper plate prior to formation of the nickel layer were also measured for comparison. The cross section of the substrate was subjected to an EDX analysis to confirm the presence of a palladium-containing region in the nickel oxide layer and the nickel layer, and to measure the thickness of the nickel oxide layer, the depth and the average palladium concentration of the palladium-containing region. The results are shown in Table 1.

TABLE 1

| | Textured substrate constitution | | | | Physical properties | |
|---|---|---|---|---|---|---|
| | | Ni layer | | | | |
| | Substrate | Total thickness | Pd-containing region | NiO layer | Δφ | Surface roughness |
| First Embodiment | Cu/SUS | 1000 nm | 180 nm Pd: 20 mass % | 10 nm | 4.57° | 5 nm |
| Comparative Example | | 1000 nm | — | — | 4.51° | 30 nm |
| Reference Example 1 | — | — | — | — | 5.17° | 20 nm |

As shown in Table 1, the formation of the nickel layer as crystal orientation improving layer allowed the crystal orientation of the surface of copper plate to be improved. Due to the formation of the nickel layer, however, the surface roughness slightly increased. In contrast, it is shown that, in First Embodiment with addition of palladium to the nickel layer and two-step heat treatment, the crystal orientation was good and the surface roughness was reduced to achieve a smooth surface.

Subsequently, an intermediate layer and a superconductive material layer were formed on the textured substrate manufactured in First Embodiment and Comparative Example so as to form a superconductive wire rod in a tape form. The constitution of the superconductive wire rod manufactured in the present embodiment is as follows. The intermediate layer and the superconductive material layer were formed by PLD.

TABLE 2

| Constitution | | Material | Film thickness |
|---|---|---|---|
| Substrate | | SUS/Cu | — |
| Intermediate layer | Barrier layer | YSZ | 100 nm |
| | Cap layer | CeO$_2$ | 400 nm |
| Superconductive film | | YBCO | 1000 nm |
| Stabilization layer | | Ag | 20 μm |

In order to confirm the effect of the nickel oxide layer in the embodiment, the properties (critical current density) of each superconductive wire rod were evaluated. In the evaluation, wire rods having a substrate without addition of palladium and without formation of a nickel oxide layer (Comparative Example) were also measured. Prior to formation of the superconductive film, a commercially available cellophane tape was attached to the intermediate layer and then detached to perform a peeling test for evaluating the adhesion of the intermediate layer. The adhesion was evaluated as "◯" when the intermediate layer was not attached to the cellophane tape at all, as "Δ" when partially attached, and as "×" when fully attached. The evaluation results are shown in Table 3.

TABLE 3

|  | Textured metal layer | Adhesion evaluation | Critical current density (77 K) |
|---|---|---|---|
| First Embodiment | Cu/Ni(Pd)/NiO | ◯ | 1.5 MA/cm$^2$ |
| Comparative Example | Cu/Ni | Δ | 0 A/cm$^2$ |

As shown in Table 3, the textured substrate of the present embodiment allowed for good adhesion of the intermediate layer and the superconductive film formed on the substrate, without causing any problem in superconductive characteristics. In contrast, the substrate in Comparative Example without formation of a nickel oxide layer had a superconductive film incapable of exhibiting the characteristics, though the adhesion of the intermediate layer was not markedly poor. Accordingly, the textured substrate cannot be sufficiently evaluated based on the crystal orientation alone.

(Second Embodiment)

A textured substrate was manufactured for a various amount of palladium added to a nickel layer. The fundamental manufacturing steps and the thickness of the nickel layer were the same as in First Embodiment. The amount of added palladium was changed depending on the change in conditions for palladium plating. The conditions for the first heat treatment (formation of a palladium-containing region) in Examples 1 to 4 and Reference Example 2 were the same as in First Embodiment, and the heat treating time was changed to 30 min in Example 5. All the conditions for the second heat treatment (formation of a nickel oxide layer) were the same as in First Embodiment.

The depth of the palladium-containing region and the surface roughness of the substrate surface were measured for the various manufactured textured substrate. The intermediate layer and the superconductive material layer were formed by the same way as described above so as to produce a superconductive wire rod in a tape form. The properties (critical current density) of each the super conductive wire rods and the adhesion of the intermediate layer were evaluated. The results are shown in Table 4.

TABLE 4

|  | Textured substrate | | | | | Evaluation result | |
|---|---|---|---|---|---|---|---|
|  | Ni layer | Amount of added Pd | Pd-containing region | NiO layer thickness | Surface roughness | Adhesion evaluation | Critical current density (77K) |
| Example 1 | 1000 nm | 1 nm | 140 nm | 30 nm | 5 nm | ◯ | 0.8 MA/cm$^2$ |
| Example 2 |  | 5 nm | 160 nm | 25 nm | 2 nm | ◯ | 1.0 MA/cm$^2$ |
| Example 3 (First Embodiment) |  | 10 nm | 180 nm | 10 nm | 5 nm | ◯ | 1.5 MA/cm$^2$ |
| Example 4 |  | 20 nm | 200 nm | 5 nm | 8 nm | ◯ | 1.2 MA/cm$^2$ |
| Example 5 |  | 5 nm | 50 nm | 26 nm | 3 nm | ◯ | 1.0 MA/cm$^2$ |
| Reference Example 2 | 1000 nm | 50 nm | 240 nm | 50 nm | 30 nm | Δ | 0 A/cm$^2$ |
| Comparative Example | — | — | — | 30 nm | Δ | 0 A/cm$^2$ |

It is noted in Table 4 the depth of the palladium-containing region and the thickness of the nickel oxide layer vary depending on the amount of added palladium to the nickel layer, and it was confirmed the proper thickness of the nickel oxide layer in Examples allowed the intermediate layer and the superconductive film to have good adhesion and superconductive characteristics. It is deemed, however, that an amount of added palladium more than the proper range causes negative effects on the superconductive characteristics.

Industrial Applicability

As described above, while the textured substrate for epitaxial film formation of the present invention ensures the crystal orientation, it pays attention to the quality of an epitaxial film formed on the substrate. The present invention provides a suitable substrate for manufacturing various materials and devices involving application of an epitaxial film and a useful substrate for oxide thin film formation such as superconductive materials and solar cells.

What is claimed is:

1. A textured substrate for epitaxial film formation comprising a textured metal layer at least on one side, wherein the textured metal layer comprises a copper layer having a cube texture and a nickel layer having a thickness of 100 to 20000 nm formed on the copper layer; the nickel layer has a nickel oxide layer formed on a surface thereof, having a thickness of 1 to 30 nm, and comprising a nickel oxide; the nickel layer further comprises a palladium-containing region formed of palladium-containing nickel at an interface with the nickel oxide layer.

2. The textured substrate for epitaxial film formation according to claim 1, wherein the surface roughness Ra of the nickel oxide surface is 10 nm or less.

3. The textured substrate for epitaxial film formation according to claim 1, wherein the palladium-containing region has a depth of 50 to 200 nm and an average of 1 to 25 mass % of palladium with a balance of nickel.

4. The textured substrate for epitaxial film formation according to claim 1, wherein the copper layer has a {100}<001> cubic texture with a deviation angle Δφ of crystal axis on a surface thereof satisfying an expression: Δφ≤6°.

5. The textured substrate for epitaxial film formation according to claim 1, wherein the copper layer includes a reinforcement material for reinforcing the layer.

6. A superconductive material comprising at least one intermediate layer and a superconductive material layer formed of an oxide superconductive material that are formed on the textured metal layer of the textured substrate for epitaxial film formation defined in claim 1.

7. The superconductive material according to claim 6, wherein the intermediate layer has at least a barrier layer and a cap layer, the barrier layer is formed of an oxide containing zirconium oxide, and the cap layer is formed of a rare earth element oxide or a composite oxide including a rare earth element.

8. The superconductive material according to claim 6, wherein the superconductive material layer is a rare earth based superconductive material.

9. A method for manufacturing the textured substrate for epitaxial film formation, said textured substrate defined claim 1, comprising the steps of: forming a nickel layer by epitaxial growth on a surface of a copper layer having a cube texture; adding palladium to a surface of the nickel layer to a film thickness equivalent of 1 to 20 nm; performing a first heat treatment by heating to a temperature of 400° C. or higher in a nonoxidizing atmosphere; and further performing a second heat treatment by heating to 400° C. or higher in a vacuum atmosphere having an oxygen partial pressure of $10^{-21}$ to 1 Pa.

10. The method for manufacturing the textured substrate for epitaxial film formation according to claim 9, wherein the method performs the step of forming a nickel layer on a surface of a copper layer by plating.

11. The method for manufacturing the textured substrate for epitaxial film formation according to claim 9, wherein the method performs the step of adding palladium to a surface of the nickel layer by plating.

12. The textured substrate for epitaxial film formation according to claim 2, wherein the palladium-containing region has a depth of 50 to 200 nm and an average of 1 to 25 mass % of palladium with a balance of nickel.

13. The textured substrate for epitaxial film formation according to claim 2, wherein the copper layer has a {100}<001> cubic texture with a deviation angle $\Delta\phi$ of crystal axis on a surface thereof satisfying an expression: $\Delta\phi \leq 6°$.

14. The textured substrate for epitaxial film formation according to claim 3, wherein the copper layer has a {100}<001> cubic texture with a deviation angle $\Delta\phi$ of crystal axis on a surface thereof satisfying an expression: $\Delta\phi \leq 6°$.

15. The textured substrate for epitaxial film formation according to claim 12, wherein the copper layer has a {100}<001> cubic texture with a deviation angle $\Delta\phi$ of crystal axis on a surface thereof satisfying an expression: $\Delta\phi \leq 6°$.

16. The textured substrate for epitaxial film formation according to claim 2, wherein the copper layer includes a reinforcement material for reinforcing the layer.

17. The textured substrate for epitaxial film formation according to claim 3, wherein the copper layer includes a reinforcement material for reinforcing the layer.

18. The textured substrate for epitaxial film formation according to claim 4, wherein the copper layer includes a reinforcement material for reinforcing the layer.

19. The textured substrate for epitaxial film formation according to claim 12, wherein the copper layer includes a reinforcement material for reinforcing the layer.

20. The textured substrate for epitaxial film formation according to claim 13, wherein the copper layer includes a reinforcement material for reinforcing the layer.

* * * * *